United States Patent
Butterbaugh et al.

(10) Patent No.: US 6,465,374 B1
(45) Date of Patent: Oct. 15, 2002

(54) METHOD OF SURFACE PREPARATION

(75) Inventors: Jeffery W. Butterbaugh, Eden Prairie; Brent Schwab, Burnsville, both of MN (US)

(73) Assignee: FSI International, Inc., Chaska, MN (US)

( * ) Notice: Subject to any disclaimer, the term of this patent is extended or adjusted under 35 U.S.C. 154(b) by 0 days.

(21) Appl. No.: 09/482,222

(22) Filed: Jan. 13, 2000

Related U.S. Application Data

(63) Continuation-in-part of application No. 08/955,355, filed on Oct. 21, 1997, now Pat. No. 6,165,273.

(51) Int. Cl.$^7$ ............................................. H01L 21/00
(52) U.S. Cl. ....................... 438/795; 438/796; 438/906
(58) Field of Search ........................ 438/795, 796, 438/906

(56) References Cited

U.S. PATENT DOCUMENTS

| | | | |
|---|---|---|---|
| 4,028,135 A | 6/1977 | Vig et al. ................. 134/1 |
| 4,167,669 A | 9/1979 | Panico ...................... 250/341 |
| 4,443,533 A | 4/1984 | Panico ...................... 430/311 |
| 4,522,674 A | 6/1985 | Ninomiya et al. .......... 156/345 |
| 4,540,466 A | 9/1985 | Nishizawa ................. 156/643 |
| 4,568,632 A | 2/1986 | Blum et al. ................ 427/53.1 |
| 4,615,756 A | 10/1986 | Tsujii et al. ................ 156/345 |
| 4,643,799 A | 2/1987 | Tsujii et al. ................ 156/345 |
| 4,678,536 A | 7/1987 | Murayama et al. ......... 156/635 |
| 4,687,544 A | 8/1987 | Bersin ....................... 156/643 |
| 4,689,112 A | 8/1987 | Bersin ....................... 156/643 |
| 4,693,779 A | 9/1987 | Okuhira et al. ............ 156/638 |
| 4,705,593 A | 11/1987 | Haigh et al. ................ 156/635 |
| 4,711,790 A | 12/1987 | Moirshige |
| 4,741,800 A | 5/1988 | Yamazuki ................... 156/643 |
| 4,749,440 A | 6/1988 | Blackwood et al. ........ 156/646 |
| 4,756,047 A | 7/1988 | Hayashi et al. ............ 15/306 B |
| 4,857,382 A | 8/1989 | Liu et al. ................... 156/345 |
| 4,871,416 A | 10/1989 | Fukuda ...................... 156/635 |
| 4,919,077 A | 4/1990 | Oda et al. .................. 118/723 |
| 4,986,216 A | 1/1991 | Ohmori et al. ............ 118/730 |
| 5,022,961 A | 6/1991 | Izumi et al. ............... 156/646 |
| 5,022,961 A | 6/1991 | Izumi et al. ............... 156/646 |
| 5,094,701 A | 3/1992 | Norman et al. ............ 148/23 |
| 5,112,437 A | 5/1992 | Watanabe et al. .......... 156/646 |
| 5,119,760 A | 6/1992 | McMillan et al. ......... 118/722 |
| 5,178,721 A | 1/1993 | Sugino ...................... 156/626 |
| 5,183,531 A | 2/1993 | Terakado ................... 156/643 |
| 5,198,388 A | 3/1993 | Kawai ....................... 437/173 |
| 5,213,621 A | 5/1993 | Irankovits et al. ......... 134/3 |
| 5,213,622 A | 5/1993 | Bohling et al. ............ 134/3 |
| 5,217,559 A | 6/1993 | Moslehi et al. ............ 156/345 |
| 5,221,366 A | 6/1993 | Roberts et al. ............ 148/22 |

(List continued on next page.)

FOREIGN PATENT DOCUMENTS

| | | |
|---|---|---|
| GB | 1180187 | 2/1970 |
| GB | 2 181 458 A | 4/1987 |
| JP | 1-235232 | 9/1983 |
| JP | 62116723 | 5/1987 |

(List continued on next page.)

OTHER PUBLICATIONS

Lawing, Scott. A. Et al., "The Mechanism of Copper Removal from a Bare Silicon Surface with Ultraviolet Excited Chlorine," Electrochemical Society Proceedings, vol. 97–35, pp. 299–306.

(List continued on next page.)

*Primary Examiner*—Thi Dang
(74) *Attorney, Agent, or Firm*—Vidas, Arrett & Steinkraus, P.A.

(57) ABSTRACT

A semiconductor substrate is heated via exposure to ultraviolet radiation substantially in the absence of a halogen containing chemical and subsequently exposed to a halogen-containing gas in the absence of ultraviolet radiation to remove contaminants therefrom.

21 Claims, 1 Drawing Sheet

U.S. PATENT DOCUMENTS

| | | | |
|---|---|---|---|
| 5,221,423 A | 6/1993 | Sugino et al. | 156/643 |
| 5,228,206 A | 7/1993 | Hiatt et al. | 150/643 |
| 5,288,333 A | 2/1994 | Tanaka et al. | 134/31 |
| 5,288,684 A | 2/1994 | Yamazaki et al. | 118/722 |
| 5,332,442 A | 7/1994 | Kubodera et al. | 118/725 |
| 5,332,444 A | 7/1994 | George et al. | 134/1 |
| 5,356,514 A | 10/1994 | Kinoshita | 156/643 |
| 5,439,553 A | 8/1995 | Grant et al. | 216/58 |
| 5,470,799 A | 11/1995 | Itoh et al. | |
| 5,571,375 A | 11/1996 | Izumi et al. | 156/646.1 |
| 5,578,133 A | 11/1996 | Sugino et al. | 134/2 |
| 5,580,421 A | 12/1996 | Hiatt et al. | 150/643 |
| 5,589,422 A | 12/1996 | Bhat | 437/228 |
| 5,725,677 A | 3/1998 | Sugino et al. | 134/1 |
| 5,762,755 A | 6/1998 | McNeilly et al. | 156/652.1 |
| 5,789,755 A | 8/1998 | Bender | 250/492.1 |
| 5,814,156 A | 9/1998 | Elliott et al. | 134/1 |
| 5,814,562 A | 9/1998 | Green et al. | 438/708 |
| 5,922,219 A | 7/1999 | Fayfield et al. | 216/58 |
| 5,954,644 A | 9/1999 | Dettling et al. | 600/322 |
| 5,954,884 A | 9/1999 | Lawing et al. | 134/1 |
| 5,992,429 A | 11/1999 | Peckman | 134/1.3 |
| 5,998,305 A | 12/1999 | Holmer et al. | 438/795 |
| 5,998,766 A | 12/1999 | Mizosaki et al. | 219/390 |
| 6,015,503 A | 1/2000 | Butterbaugh et al. | 216/66 |
| 6,015,759 A | 1/2000 | Khan et al. | 438/707 |
| 6,065,481 A | 5/2000 | Fayfield et al. | 134/1.3 |

FOREIGN PATENT DOCUMENTS

| | | |
|---|---|---|
| JP | 4-25116 | 1/1992 |
| JP | 04064225 | 2/1992 |
| JP | 04069933 | 3/1992 |
| JP | 5-047741 | 2/1993 |
| WO | 90/13910 | 11/1990 |
| WO | 91/03075 | 3/1991 |

OTHER PUBLICATIONS

Butterbaugh et al., "Recent Results of Ultraviolet–Initiated Processes for Cleaning and Etching of Silicon", *Proceedings of the Second International Symposium on Ultra–clean Processing of Silicon Surfaces*, (Acco Leuven, 1994), p. 229–233.

Daffron et al., "Removal of Al from Silicon Surfaces using UV/Cl$_2$", *Proceedings of the Third International Symposium on Cleaning Technology in Semiconductor Device Manufacturing, ECS Proceedings*, vol. 94–7, pp. 281–287, (Electrochemical Society, 1994).

Deal et al., "Vapor Phase Cleaning of Silicon Wafers," *Mat. Res. Soc. Symp. Proc.*, vol. 259, pp. 361–373 (Materials Research Society, 1992).

Deal et al., "Vapor Phase Wafer Cleaning Technology," *Handbook of Semiconductor Wafer Cleaning Technology*, W. Kern ed., pp. 274–339 (Noyes Publications, 1993).

DeLarios et al., "Gas–Phase Cleaning of Trace Metal and Organic Contaminants from Wafers: Ultravioley Irradiated Oxygen–Based and Chlorine–Based Chemistries," *Proceedings of Microcontamination 92*, Oct. 27–30, 1992, Santa Clara, Ca, pp. 706–717 (1992).

Ito et al., "Photo–Excited Cleaning of Silicon with Chlorine and Fluorine," *Mat. Res. Soc. Symp. Proc.*, vol. 259, pp. 195–205 (Materials Research Society, 1992). Published by: Canon Communications, 1992, Santa Monica, Ca, USA.

Ito et al., "UV–Enhanced Dry Cleaning of Silicon Wafers", *Proceedings of the First International Symposium on Cleaning Technology in Semiconductor Device Manufacturing, ECS Proceedings*, vol. 90–9, (Electrochemical Society, 1990), pp. 114–120.

Limb et al., "Removal of Fe and Al Pyrochemical Cleaning", *Proceedings of the Thrid International Symposium on Cleaning Technology in Semiconductor Device Manufacturing*, vol. 94–7, pp. 409–415 (1994).

Ma et al., "Vapor Phase Sio$_2$ Etching and Metallic Contamination Removal in an Integrated Cluster System," *J. Vac. Sci Technol. B*, vol. 13, No. 4, pp. 1460–1465 (1995).

Sugino et al., "Removal of Fe and Al on a Silicon Surface Using UV–Excited Dry Cleaning," IEICE Transactions on Electronics, vol. E75–C, No. 7, pp. 829–833, Jul. 1992.

Wolf et al., "Silicon Processing for the VLSIERA", *Process Technology*, vol. 1, Second Edition (2000). CK1 Section 5.5.2—p. 131–133 and CK2 Section 7.5.1—p. 238–239.

Derwent patent abstract, JP 62–166529, (7/87).

Derwent patent abstract, KR 9405754 (6/94).

Derwent patent abstract, KR 9301193 (2/93).

Derwent patent abstract, JP 5070295 (3/93).

Derwent patent abstract, JP 62–174925 (7/87).

Derwent patent abstract, JP 62086731 (4/87).

Derwent patent abstract, JP 52144021 (12/77).

Derwent patent abstract, JP 61–053731 (3/86).

Derwent patent abstract, JP 61–51585 (5/94).

Patent abstract of Japan, abstract of JP 63–297563 (5/88).

JAPIO patent abstract, JP 01–104682 (4/89).

JAPIO patent abstract, JP 06–157190 (6/94).

JAPIO patent abstract, JP 01–235232 (9/89).

IFI/Plenum patent abstract, US 5,451,425 (9/95).

IFI/Plenum patent abstract, US 4,798,960 (1/89).

Aoyama, T. et al., "Surface Cleaning for Si Epitaxy Using Photoexcited Flourine Gas," *J. Electrochem Soc.*, 140:366–371, (Feb. 1993).

Ito, Takashi, "Wafer, Cleaning with Photo–Excited Halogen Radicals," *Proceedings*, 808–811 (1991).

Lawing, Scott A. et al., "UV/Cl$_2$ Etching andn Cleaning of Wafer Surfaces," *FSI Internation Technical Report*, (Fall, 1995).

Meguro, T., "Tunable UV laser induced digital etching of Ca As: wavelength dependence of etch rate and surface processes," *Applied Surface Science*, 106:365–368 (1996).

Ruzyllo, Section 7–3 of Semiconductor Wafer Cleaning Technology, (2/93).

Sesselmann, W., "Chemical etching of silicon induced by excimer laser radiation," *Chemtronics*, 4:135–140 (Sep. 1989).

METHOD OF SURFACE PREPARATION

CROSS-REFERENCE TO RELATED APPLICATIONS

This application is a Continuation-In-Part application from U.S. application Ser. No. 08/955,355, filed Oct. 21, 1997, now U.S. Pat. No. 6,165,273 the contents of which is hereby incorporated by reference.

BACKGROUND OF THE INVENTION

The present invention pertains to a process for gas phase removal of contaminants such as oxides, organics and metals from the surface of a substrate.

The removal of contamination from a substrate is an important step in the semiconductor fabrication process. Trace metals and other contaminants can cause degradation of device performance if not removed from the substrate surface. Contamination, whether in the form of oxide, organics or metals, can arise from a number of sources including wet chemicals, photoresist, ion implantation and redeposition of sputtered materials from chamber surfaces during plasma processing.

Many different etching and cleaning techniques have been developed for various semiconductor processes. Typically in the past, wet etches, such as "RCA Clean", dominated in semiconductor fabrication processes. Gradually, as device structures have shrunk and the move toward VLSI devices grown, dry etches have gained prominence. These dry etches include plasma and gas-based etches and many were developed originally for removing oxides and carbon-based contaminants.

For dry gas-phase metal removal, for example, several systems have been reported. U.S. Pat. Nos. 5,094,701 and 5,221,366 disclose use of beta-diketone and beta-ketoimine ligand forming compounds, which are dispersed in an oxidizing atmosphere. At a sufficient temperature, volatile metal-ligand complexes are reported to be formed and then sublimed from the surface. Temperatures of 200° C. to 300° C. are indicated to be required. U.S. Pat. Nos. 5,213,621, 5,213,622, and 5,332,444 disclose other ligand forming chemical reagents which reportedly can be used in a similar manner to form volatile metal-ligand complexes with surface impurities which then can be sublimed from the surface.

Other dry gas-phase removal techniques involve the use of ultraviolet radiation to generate cleaning radicals. Sugino et al. (IEIC Trans. Electron. Vol. E75-C, No. 7, July 1992) describe a system for removal of Fe and Al on a silicon surface using photoexcited chlorine radicals at approximately 20 Torr and 170° C. as a cleaning gas. U.S. Pat. No. 5,221,423 issued to Sugino discloses a method for removing Al, Fe, Na and Cr by irradiating chlorine gas at a partial chlorine pressure of 20 Torr to produce chlorine radicals. U.S. Pat. No. 5,178,721 issued to Sugino discloses a Uv radical generating cleaning method in which the pressure of the chlorine gas and the pathlength of the UV are varied to maximize radical generation and cleaning efficiency. In that system, the chlorine pressure ranges from 1 Torr to atmospheric pressure. Ito (Proc. Instit. for Environ. Studies 1991 p.808) discloses a method for cleaning using photoexcited chlorine radicals wherein the chlorine is delivered at a pressure of 20 Torr.

Commonly assigned U.S. Pat. No. 5,954,884 discloses a chlorine based dry-cleaning system appropriate for removing metal contaminants from the surface of substrate in which the metal contaminant is chlorinated and reduced to a volatile metal chloride by UV irradiation.

Along with the advances in process design, advances have been made in equipment design to facilitate efficient implementation of the ever-more complex treatment processes. To that end, commonly assigned U.S. application Ser. No. 08/955355 discloses an apparatus which provides for the dual use of a UV source to heat a substrate and to facilitate photochemistry necessary for the treatment of the substrate.

There continues, however, to be a need for improved processes for removal of contaminants from substrates such as semiconductor substrates and substrates in micromechanical devices and the like. This need is amplified by the increasingly stringent performance criteria associated with the continuing drive toward miniaturization of semiconductors.

All U.S. patents and applications and all other published documents mentioned anywhere in this application are incorporated herein by reference in their entirety.

BRIEF SUMMARY OF THE INVENTION

The present invention is directed in one embodiment toward a gas phase process of removing contaminants from a semiconductor substrate without roughening the substrate. The method comprises the steps of irradiating the substrate in the absence of a halogen-containing gas followed by exposing the substrate to a halogen-containing gas in the absence of ultraviolet radiation. In another embodiment, the invention is directed toward a method of treating a semiconductor substrate to remove contaminants such as silicon oxides, organic and metallics from the surface of the substrate without excessive surface roughening and without destroying desirable features on the surface of the substrate such as shallow trench isolation. The method comprises the steps of heating the substrate via the application of ultraviolet radiation in the absence of a halogen-containing gas followed by exposing the heated substrate to a halogen-containing gas in the absence of ultraviolet radiation.

In yet another embodiment the invention is directed to a method of treating a substrate comprising the steps of performing an oxide etch, heating the substrate via the application of ultraviolet radiation in the absence of a halogen-containing gas, exposing the heated substrate to a halogen-containing gas in the absence of ultraviolet radiation and subsequently oxidizing the substrate.

DETAILED DESCRIPTION OF THE INVENTION

Figure 1:
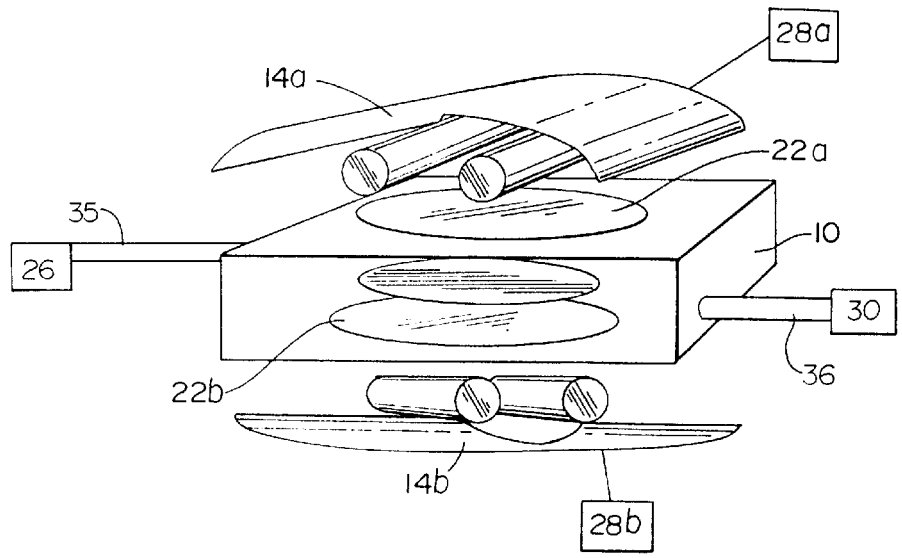
FIG. 1 shows a schematic of a wafer processing tool suitable for use in the practice of the invention.

While this invention may be embodied in many different forms, there are described in detail herein specific preferred embodiments of the invention. This description is an exemplification of the principles of the invention and is not intended to limit the invention to the particular embodiments illustrated.

The present invention pertains to processes for gas phase removal of contaminants such as oxides, organics and metals from the surface of a substrate. In general, the invention may be used to treat any microelectronic device precursor. In accordance with various embodiments of the invention, contaminants may be removed without excessive surface roughening and without destroying desirable features on the surface of the substrate.

The inventive processes are particularly suitable for cleaning a silicon substrate before depositing a transistor gate oxide. Other applications of the inventive processes include cleaning the surface of a substrate in preparation for epitaxial silicon deposition.

In one embodiment, the present invention is directed to a method of cleaning a semiconductor substrate such as a silicon substrate without exposing the bare substrate to halogen radicals. The method comprises the steps of providing a semiconductor substrate in a process chamber such as an FSI® ORION® dry gas phase wafer processing tool, applying ultraviolet radiation to the substrate substantially or entirely in the absence of a halogen-containing gas and subsequently exposing the substrate to a halogen-containing gas in the absence of ultraviolet radiation. Where a halogen-containing gas has been present in the process chamber prior to the UV heating step, it is desirable to evacuate the gas from the chamber. It may not be necessary to completely evacuate the gas, but the halogen-containing gas should be substantially evacuated from the chamber so that halogen radicals are not generated in the heating step. In certain circumstances, up to 1 Torr of the halogen-containing gas may be present during UV heating. Typically, however, no more than 10 to 100 milli-Torr of the halogen-containing gas is present during UV heating. Desirably, the ultraviolet radiation will heat the substrate effectively to remove contaminants therefrom. Desirably, the wafer will be heated to a temperature from about 40° C. to about 500° C. More desirably, the wafer will be heated to a temperature from about 80° C. to about 350° C. Most desirably, the wafer will be heated to a temperature of about 100° C. Typically, the UV radiation will heat the substrate to a temperature in excess of about 60° C. to 80° C. over the temperature of the substrate prior to UV heating.

As discussed above, the invention calls for the use of a halogen-containing gas to treat the substrate following WV heating. Desirably, the halogen-containing gas will contain chlorine. More desirably, the halogen-containing gas will be $Cl_2$.

Without being bound thereby, it is believed that the application of UV energy prior to treatment with halogen gas provides a dual benefit of heating the substrate to the desired temperature and chemically preparing the surface in a way that is not possible with conventional heating techniques.

Optionally, the inventive method may further include steps preceding the inventive treatment and/or following the inventive treatment.

Where the substrate to be treated includes oxides or native oxides on the surface thereof, it may be desirable to include a preparatory step to remove some or all of the oxide from the surface of the substrate. One such suitable preparation step involves exposing the substrate to gaseous (optionally anhydrous) hydrogen fluoride (HF), gaseous isopropyl alcohol (IPA) and optionally water as known in the art. The use of gaseous anhydrous hydrogen fluoride (HF), gaseous isopropyl alcohol (IPA) and optionally a small amount of water is disclosed in U.S. Pat. No. 5,022,961 issued to Izumi. The use of HF and alcohol is discussed, inter alia, in commonly assigned U.S. Pat. No. 5,922,219 issued to Fayfield and Schwab and copending and commonly assigned U.S. application Ser. Nos. 08/824512 and 09/098096. In this way, sacrificial and/or chemical and/or native oxide contamination may be removed from the surface of the substrate in advance of the UV heating step. Another suitable preparation step involves exposing the substrate to a UV/halogen treatment step, as known in the art. In this case, the use of halogen radicals is suitable because the substrate does not contain bare silicon.

As an example of a post-treatment process, the substrate, having been treated in accordance with the inventive method, may be further subjected to a deposition process in which at least one predetermined substance is deposited on the substrate or a thin film grown on the substrate. Another post-treatment process involves an oxidation step, such as exposing the substrate to oxygen with or without the simultaneous exposure to UV radiation and UV wafer heating.

In addition to being useful as a treatment method for silicon and silicon containing substrates, the above-disclosed methods may also be used for treating other substrates including gallium arsenide-based substrates. The method finds particular use in the treatment of semiconductor substrates. Other substrates which may be used in the practice of the inventive method include multiple chip carriers, flat panel displays and other electronic devices. More generally, the inventive methods disclosed herein may be used to treat any microelectronic device precursor.

As mentioned above, a suitable tool for use in practicing many of the inventive methods disclosed herein is an FSI® ORION® dry gas phase wafer processing tool. The tool is supplied by FSI International Inc. Chaska, Minn. and is capable of operating under vacuum conditions.

As shown schematically in FIG. 1 the ORION dry gas phase wafer processing tool includes a process chamber, shown generally at 10, a first UV radiation source comprising lamphouse 14a mounted on the exterior of the frontside of the process chamber 10 and a second UV radiation source comprising lamphouse 14b mounted on the exterior of the backside of the process chamber 10. The bottom lamphouse is optionally rotated 90 degrees relative to the front side lamphouse. The presence of lamphouses on both sides of the process chamber allows for illumination of both sides of the wafer. The frontside of the chamber 10 and the backside of the chamber include UV transparent windows 22a,b to allow UV light to pass from lamphouse 14a,b into the interior of the chamber to reach the substrate. A control system for controlling the UV radiation is shown at 28a,b. The tool further comprises a chemical delivery system shown at 26 and a vacuum pump 30 connected to the chamber 10. In operation, chemicals are delivered into the chamber 10 through inlet 35 and are exhausted through outlet 36. Further details of the ORION dry gas phase wafer processing tool may be found in commonly assigned, copending U.S. applications Ser. Nos. 08/955355, 08/860071 and 08/824512 as well as in U.S. Pat. No. 5,580,421.

Figure 2:
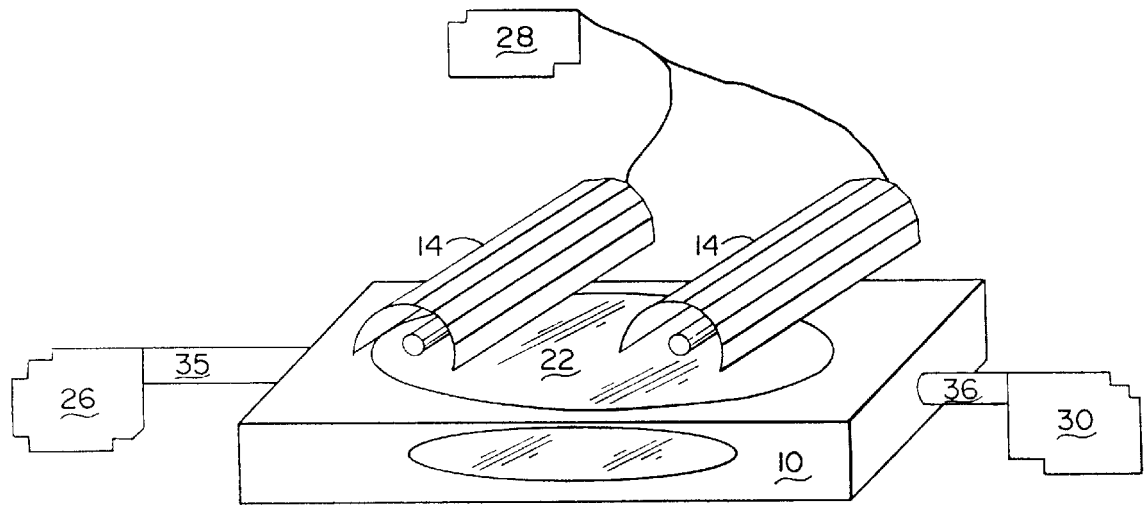
FIG. 2 shows a schematic of another wafer processing tool suitable for use in the practice of the intervention.

Another suitable dry gas phase wafer processing tool is shown schematically, in FIG. 2. The tool shown in FIG. 2 includes a process chamber, shown generally at 10 and a UV radiation source comprising a lamphouse 14 mounted on the exterior of the reaction chamber 10. The front of the chamber 10 includes a UV transparent window 22 to allow UV light to pass from the lamphouse 14 into the interior of the chamber to reach the substrate. A chemical delivery system is shown at 26 while a control system for controlling the UV radiation is shown at 28. A vacuum pump 30 is connected to the chamber 10. In operation, chemicals are delivered into the chamber 10 through inlet 35 and are exhausted through outlet 36.

Other suitable processing systems may also be used in the practice of the inventive methods.

A silicon or other wafer with oxide thereon may be placed into the process chamber of an FSI® ORION platform. The oxidized wafer may initially be treated to remove organic contamination by heating the wafer to a temperature above ambient and desirably to a temperature between about 40° C. and 100° C. via UV exposure in the presence of chlorine as is known in the art. Desirably, the chlorine will be provided at a pressure ranging from 0.1 Torr to 150 Torr and more desirably at a pressure of 10 Torr. The chlorine gas is then pumped out of the process chamber to below 1 Torr and more desirably, to a pressure of below 10 milliTorr to 100 milliTorr. An oxide etch may then be performed by exposing the wafer to gaseous anhydrous hydrogen fluoride (HF) and gaseous isopropyl alcohol (IPA), as is known in the art, to remove any undesirable oxide from the surface of the wafer to exposed bare, unoxidized surface. The process chamber may then be evacuated and the wafer heated by UV illumination. Desirably, the wafer will be heated to a temperature from about 40° C. to about 500° C. More desirably, the wafer will be heated to a temperature from about 80° C. to about 350° C. Most desirably, the wafer will be heated to a temperature of about 100° C. The UV radiation is then terminated and a halogen containing chemical such as chlorine gas supplied to the process chamber. Desirably, chlorine gas will be supplied at a pressure from about 0.1 Torr to 150 Torr and more desirably, at about 10 Torr. The chlorine gas reacts with the hot surface of the substrate causing the volatilization of metallic and other contaminants present on the surface of the wafer. It is believed that during this step, chlorine may be physi-sorbed or chemi-sorbed on the surface of the wafer.

The chlorine gas is then pumped out of the chamber and the wafer removed for a subsequent processing such as a thin film growth or deposition.

The treatment method results in the removal of contaminants such as silicon oxides, organics and metallics from the wafer surface without excessive surface roughening.

The invention is illustrated by the following non-limiting examples. In each of the examples, an FSI® ORION® dry gas phase wafer processing tool was used.

EXAMPLES 1–6

In the examples below, UV radiation was provided by a pulsed UV source comprising a xenon lamp (CFQ clear fused quartz Xenon bulb manufactured by Xenon corporation with a spectral cutoff of 190 nm) powered by a 2000 watt Xenon RC 740 power supply. The power supply was configured as a pulse forming network with a $32\mu$ farad capacitor and a $50\mu$ henry inductor. The UV lamp was pulsed at a rate of 7 pulses per second and at a peak capacitor voltage of 3600 Volts resulting in a 1450 Watt power output. The substrate was positioned within approximately 3 to 4 inches from the lamp.

Wafer Preparation

For each of examples 1–6, a silicon wafer was placed in a process chamber and prepared by exposing the wafer to chlorine gas (10 Torr, ~400 sccm) in the presence of UV radiation for a period of time sufficient to heat the wafer to 45° C. (typically, 5 to 6 seconds). The process chamber was then evacuated to less than 1 Torr and the wafer exposed to gaseous anhydrous HF (1000 sccm—standard cc/minute) and gaseous IPA (40 sccm) in the presence of nitrogen (1000 sccm) for a sufficient period of time to remove 200 Å of thermal oxide from the surface of the substrate. The total pressure in the process chamber was 100 Torr. The chamber was then evacuated and the thus prepared wafer subject to treatment steps described below.

Post-treatment

Following preparation of the wafer and treatment of the wafer, an oxygen cap was provided by flowing 1000 sccm of oxygen to the wafer for 120 seconds, optionally in the presence of UV radiation. The wafer was then analyzed to determine root mean square (RMS) surface roughness. RMS surface roughness was measured using atomic force microscopy. RMS surface roughness is reported in Table 1 below.

Comparative Example 1

A wafer was prepared as described above in Wafer Preparation. Following preparation of the wafer and without further processing the wafer was subjected to a post-treatment as described above in Post-treatment. The Post-treatment was carried out in presence of UV radiation from a backside lamp for 120 seconds which heated the wafer to approximately 250° C.

Comparative Example 2

A wafer was prepared as described above in Wafer Preparation. Following preparation of the wafer, the wafer was subjected to UV radiation in the presence of chlorine (10 Torr) using top and bottom lamps for 50 seconds which heated the wafer to a temperature in excess of 300° C. The chamber was evacuated and the wafer then processed in accordance with the Post-treatrnent in the absence of UV radiation.

Inventive Example 3

A wafer was prepared as described above in Wafer Preparation. Following preparation of the wafer, the wafer was subjected to UV radiation using a backside lamp for 30 seconds and heated to about 130° C. The UV lamp was turned off and chlorine gas (10 Torr) supplied to the chamber for 30 seconds. The chamber was then evacuated and the wafer then processed in accordance with the Post-treatment. UV radiation was applied during the Post-treatment using the backside lamp.

Comparative Example 4

A wafer was prepared as described above in Wafer Preparation. Following preparation of the wafer, the wafer was subjected to UV radiation using top and bottom lamps for 10 seconds and heated to about 120° C. During this time, the wafer was also exposed to chlorine gas (10 Torr). The UV lamp was turned off and the chamber evacuated. The wafer was then processed in accordance with the Post-treatment. UV radiation was applied during the Post-treatment using the backside lamp.

Comparative Example 5

A wafer was treated in accordance with Example 4, the treatment differing in that following the oxide etch, the simultaneous UV heating and chlorine exposure lasted for 30 seconds and heated the wafer to about 230° C.

Inventive Example 6

A wafer was treated in accordance with Example 4, the treatment differing in that the wafer was exposed to UV radiation at a heating level in the absence of the halogen-containing gas using two lamps for 50 seconds subsequent to the oxide etch. The wafer was heated to about 300° C. The UV lamp was turned off and chlorine gas supplied to the chamber for 30 seconds. The chamber was then evacuated and the wafer was processed in accordance with the Post-treatment. UV radiation was applied during the Post-treatment using the backside lamp.

TABLE 1

Surface Analysis

| Example | Pre-measure rms | Post-measure rms | Z-range (Pre) | Z-range (Post) | Oxide Thickness |
|---|---|---|---|---|---|
| 1 | 0.77 Å | 0.66 Å | 6.67 Å | 10.2 Å | ~6 Å |
| 2 | 0.65 Å | 1.76 Å | 11.96 Å | 32.75 Å | ~2 Å |
| 3 | 0.76 Å | 0.68 Å | 24.85 Å | 5.78 Å | ~6 Å |
| 4 | 0.63 Å | 1.76 Å | 5.30 Å | 19.07 Å | ~6 Å |
| 5 | 0.75 Å | 2.28 Å | 19.79 Å | 23.69 Å | ~6 Å |
| 6 | 0.73 Å | 0.95 Å | 15.35 Å | 9.92 Å | ~6 Å |

In Table 1, Pre-measure rms designates the root mean square surface roughness prior to treatment of the wafer. Post-measure rms designates the root mean square surface roughness following treatment of the wafer. Z-range (Pre) designates the difference in surface roughness from peak to valley prior to treatment of the wafer. Z-range (Post) designates the difference in surface roughness from peak to valley following treatment of the wafer. Finally, thickness designates the thickness of the oxide layer following the oxide cap. Roughness measurements were made using Atomic Force Microscopy.

As shown in table 1, the wafer of Example 2 showed an increased rms surface roughness relative to the wafers of Examples 1 and 3. This increased rms surface roughening is believed to result from the simultaneous exposure of the wafer to chlorine gas and heating of the wafer with UV radiation following preparation.

Further, the wafer of Example 6, treated in accordance with the inventive method, showed a reduced rms surface roughness relative to the wafers of Examples 4 and 5. The wafers of Examples 4 and 5 were simultaneously exposed to chlorine gas and heating of the wafer with UV radiation.

The invention is further directed to substrates treated in accordance with the inventive methods disclosed herein as well as to devices containing such substrates.

In addition to the specific embodiments claimed below, the invention is also directed to other embodiments having any other possible combination of the dependent features claimed below.

The above Examples and disclosure are intended to be illustrative and not exhaustive. These examples and description will suggest many variations and alternatives to one of ordinary skill in this art. All these alternatives and variations are intended to be included within the scope of the attached claims. Those familiar with the art may recognize other equivalents to the specific embodiments described herein which equivalents are also intended to be encompassed by the claims attached hereto.

What is claimed is:

1. A method of treating a semiconductor substrate comprising the steps of:
    providing a semiconductor substrate having oxides on the surface thereof in a process chamber;
    applying ultraviolet radiation to the substrate substantially in the absence of a halogen containing chemical to heat the substrate;
    exposing the heated substrate, in the absence of ultraviolet radiation to a halogen-containing gas; and
    preparing the substrate prior to heating the substrate to remove at least some of the oxide on the surface of the substrate.

2. The method of claim 1 wherein substantially all of the oxide is removed during the preparation of the substrate.

3. The method of claim 1 wherein the during the preparation of the substrate, the substrate is exposed to gaseous anhydrous HF and gaseous IPA.

4. A method of treating a semiconductor substrate comprising the steps of:
    providing a semiconductor substrate in a process chamber;
    applying ultraviolet radiation to the substrate substantially in the absence of a halogen containing chemical to heat the substrate;
    exposing the heated substrate, in the absence of ultraviolet radiation to a halogen-containing gas; and
    depositing silicon on the substrate.

5. The method of claim 4 further comprising the step of oxidizing the semiconductor substrate following the exposing step.

6. The method of claim 5 wherein the semiconductor is exposed to ultraviolet radiation during the oxidizing step.

7. The method of claim 6 wherein the ultraviolet radiation is applied at a heating level during the oxidizing step.

8. A method of treating a gallium arsenide semiconductor substrate comprising the steps of:
    providing a gallium arsenide semiconductor substrate in a process chamber;
    applying ultraviolet radiation to the substrate substantially in the absence of a halogen containing chemical to heat the substrate; and
    exposing the heated substrate, in the absence of ultraviolet radiation to a halogen-containing gas.

9. A method of treating a semiconductor substrate comprising the steps of:
    providing a semiconductor substrate in a process chamber;
    applying ultraviolet radiation to the substrate substantially in the absence of a halogen containing chemical to heat the substrate; and
    exposing the heated substrate, in the absence of ultraviolet radiation to a halogen-containing gas wherein the halogen-containing gas contains chlorine.

10. The method of claim 9 wherein the halogen-containing gas is $Cl_2$.

11. The method of claim 2 further comprising the step of oxidizing the semiconductor substrate following the exposing step.

12. The method of claim 10 wherein during the applying step, the substrate is heated to a temperature of at least about 80° C.

13. The method of claim 10 wherein during the applying step, the substrate is heated to a temperature of at least about 100° C.

14. The method of claim 10 wherein during the applying step, the substrate is heated to a temperature of at least 60° C. above the temperature of the substrate prior to the applying step.

15. A method of treating a semiconductor substrate comprising the steps of:
    providing a semiconductor substrate including oxides on the surface thereof in a process chamber;
    removing at least some of the oxide on the surface of the substrate;
    applying ultraviolet radiation to the substrate substantially in the absence of a halogen containing chemical to heat the substrate;
    exposing the heated substrate, in the absence of ultraviolet radiation to a halogen-containing gas; and oxidizing the semiconductor substrate following the exposing step.

16. The method of claim 15 wherein the substrate comprises silicon and the halogen-containing gas comprises chlorine.

17. The method of claim 15 wherein the ultraviolet radiation is applied to the substrate to heat the substrate in the absence of a halogen-containing gas.

18. The method of claim 15 wherein prior to the removing step, the substrate is heated to a predetermined temperature via exposure to ultraviolet radiation and the substrate is exposed to a halogen-containing gas.

19. The method of claim 15 wherein the process chamber is substantially evacuated following the removing step and before applying the ultraviolet radiation to heat the substrate.

20. A method of treating a substrate comprising the steps of:

providing a substrate including oxides on the surface thereof in a process chamber;

preparing the substrate to remove at least some of the oxide from the substrate;

applying ultraviolet radiation to the substrate to heat the substrate; and exposing the heated substrate, in the absence of ultraviolet radiation to a halogen-containing gas.

21. The method of claim 20 wherein the exposing step is followed by a post-teatment process in which the surface of the substrate is at least partially oxidized.

* * * * *